United States Patent [19]
Yu et al.

[11] Patent Number: 6,064,574
[45] Date of Patent: May 16, 2000

[54] FOLDABLE RETENTION MECHANISM

[75] Inventors: Hung-Chi Yu, Hsi-Chih; Wesley Lin, Pen-Chiao, both of Taiwan

[73] Assignee: Hon Hai Precision Ind. Co., Ltd., Taipei Hsien, Taiwan

[21] Appl. No.: 09/357,532

[22] Filed: Jul. 19, 1999

[30] Foreign Application Priority Data

Dec. 18, 1998 [TW] Taiwan ................................. 87221136

[51] Int. Cl.[7] .................................................. H05K 7/20
[52] U.S. Cl. ........................ 361/704; 361/690; 361/703; 361/732; 361/741; 361/759; 361/801; 361/747; 361/756; 361/788; 165/80.3; 165/121; 165/185; 257/719; 439/326; 211/41.17; 174/16.3
[58] Field of Search ..................... 361/704, 690, 361/683, 697, 709, 732, 746, 759, 756, 801, 802, 740; 439/64, 326, 62, 377, 328, 157, 160; 257/706–727; 174/16.3, 252; 211/41.1, 41.17, 47; 165/80.3, 80.4, 121, 185; 411/549

[56] References Cited

U.S. PATENT DOCUMENTS

| | | | |
|---|---|---|---|
| 5,569,043 | 10/1996 | Liu | 439/326 |
| 5,748,446 | 5/1998 | Feightner et al. | 361/709 |
| 5,841,633 | 11/1998 | Huang | 361/695 |
| 5,854,738 | 12/1998 | Bowler | 361/695 |
| 5,889,656 | 3/1999 | Yin | 361/801 |

*Primary Examiner*—Leo P. Picard
*Assistant Examiner*—Michael Datskovsky
*Attorney, Agent, or Firm*—Wei Te Chung

[57] ABSTRACT

A foldable retention mechanism includes a pair of bases, two retaining arm members and two locking members. The retaining arm members are attached to the corresponding base. Each retaining arm member defines a guiding slot. A locking member is positioned proximate a free end of each retaining arm member. Each retaining arm member defines a receiving space for engaging with a corresponding projection of a heat sink.

7 Claims, 7 Drawing Sheets

FOLDABLE RETENTION MECHANISM

BACKGROUND OF THE INVENTION

The present invention relates to a foldable retention mechanism, and particularly to a mechanism for retaining a CPU package. A related invention is disclosed in U.S. Pat. No. 5,748,466. Referring to FIG. 1, a conventional retention mechanism has base 2 and two retaining arm members 1 connected to opposite lateral ends of the base 2 by a pair of lugs 21. A guiding slot 11 is defined in each arm 1. A locking member 3 is positioned at a free end of each retaining arm member 1. A CPU package and a heat sink (not shown) can be received between the guiding slots 11. However, the conventional retention mechanism can only accommodate a CPU package and heat sink of fixed thickness. To fulfill the needs of a CPU package and heat sink of different thickness, a corresponding retention mechanism must be provided. Thus, an improved retention mechanism is required which can accommodate different types of CPU packages and heat sinks.

BRIEF SUMMARY OF THE INVENTION

A main object of the present invention is to provide a universal foldable retention mechanism for retaining different types of CPU packages and heat sinks.

To fulfill the above mentioned object, a folded retention mechanism comprises a pair of bases, two retaining arm members and two locking members. The retaining arm members are attached to the corresponding base. Each arm defines a guiding slot. A locking member is positioned proximate a free end of each arm. Each guiding slot defines a space for receiving lateral portions of a CPU package and a heat sink. Each arm defines a recess for engaging with the heat sink. The recess may be formed as a receiving cutout.

Other objects, advantages and novel features of the invention will become more apparent from the following detailed description when taken in conjunction with the accompanying drawings.

DETAILED DESCRIPTION OF THE INVENTION

Figure 1:
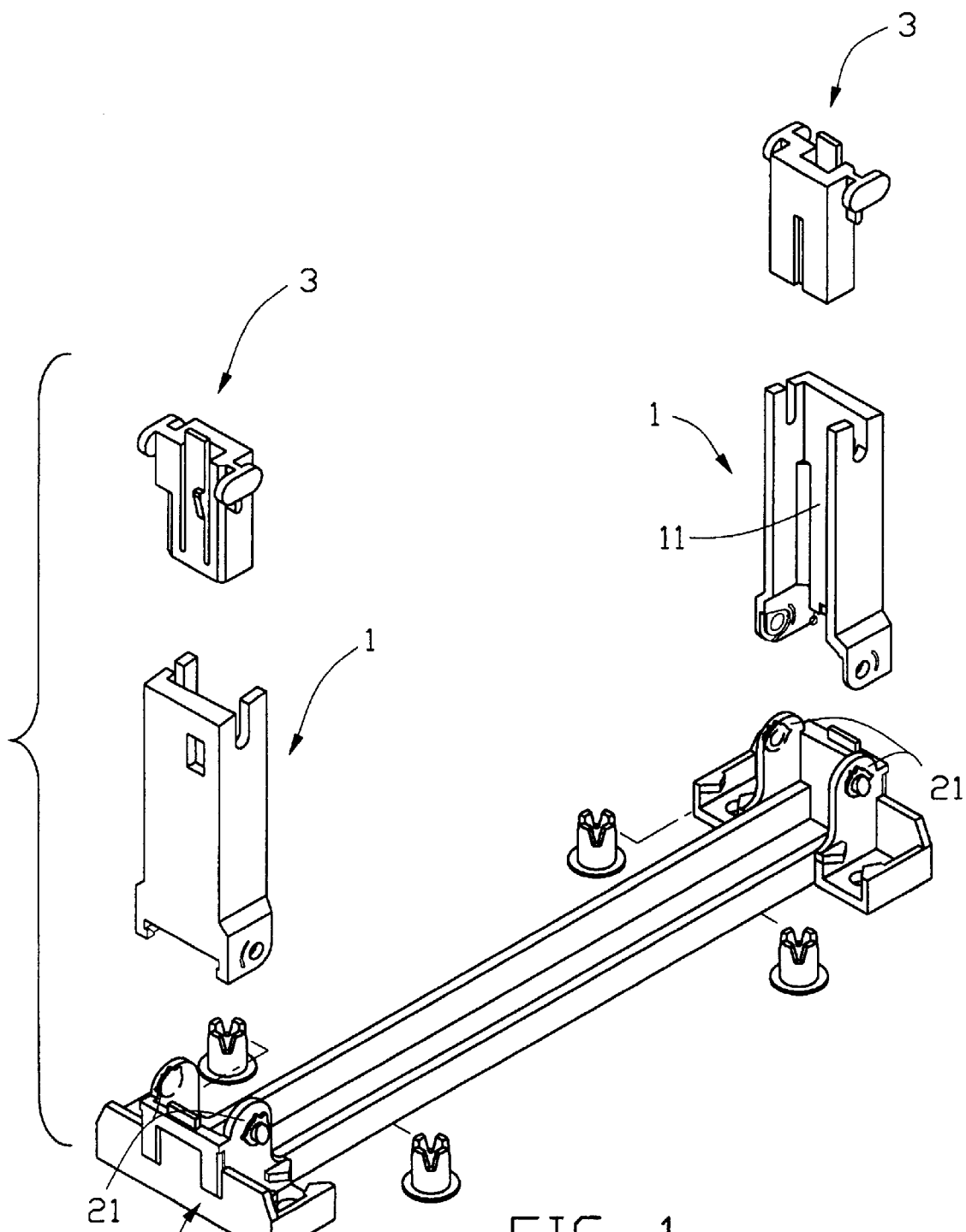
FIG. 1 is an exploded view of a conventional retention mechanism.
Figure 2:
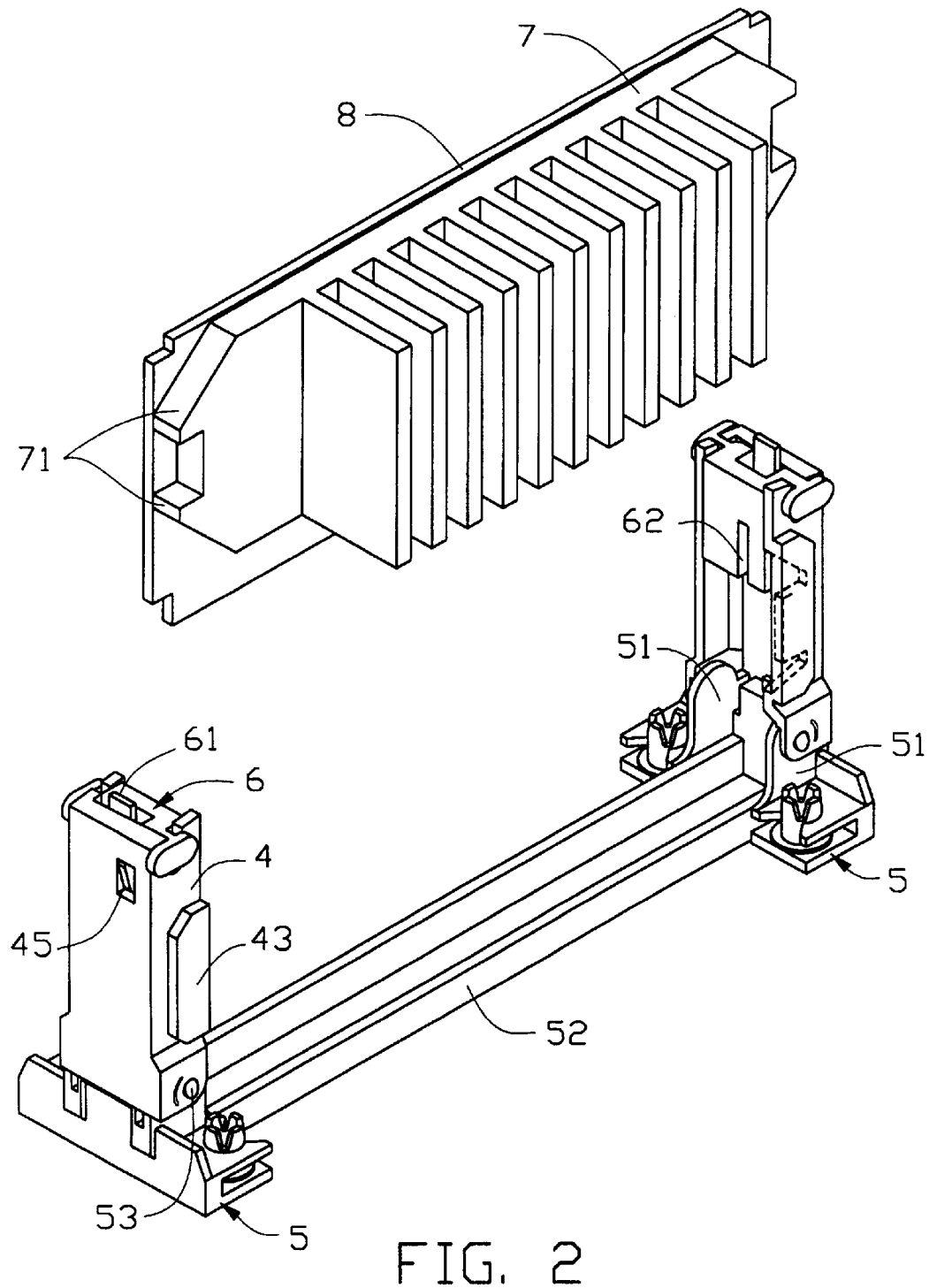
FIG. 2 is a perspective view of a foldable retention mechanism in accordance with a first embodiment of the present invention, a CPU, and a heat sink.
Figure 3:
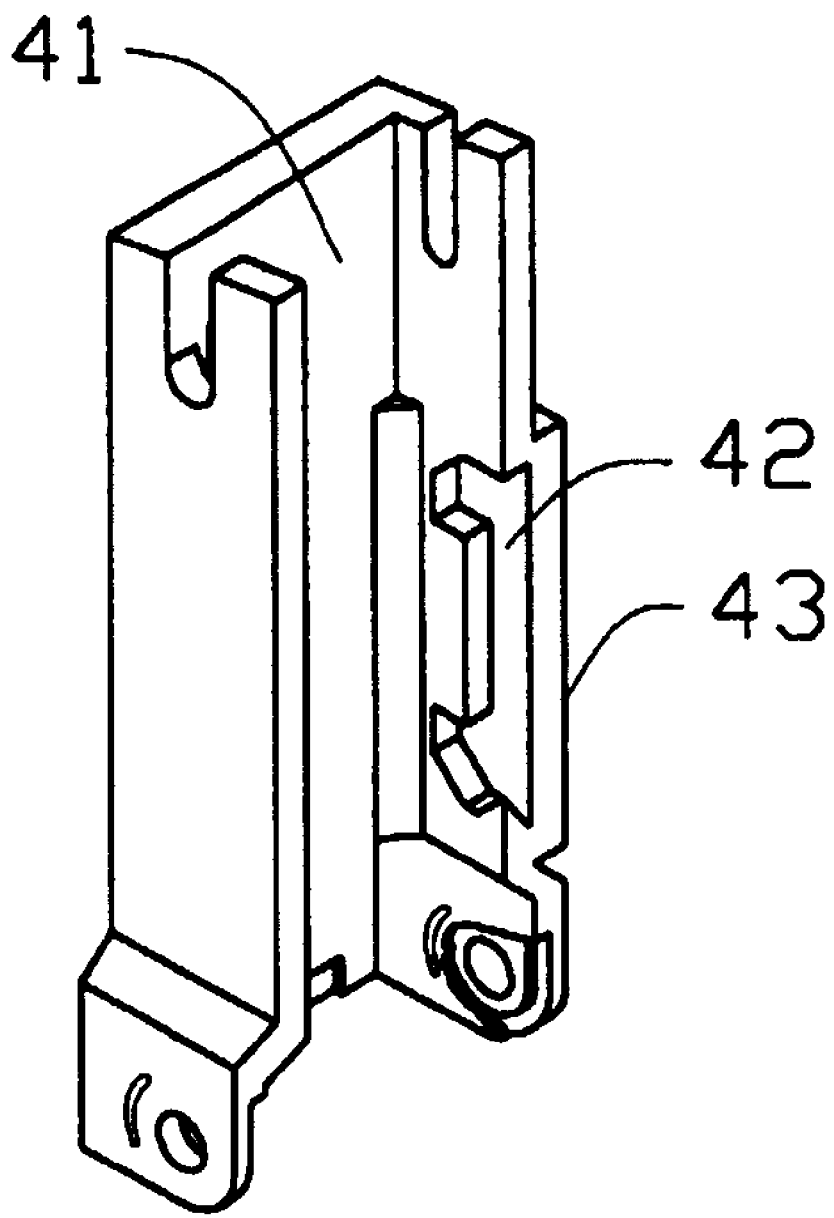
FIG. 3 is a perspective view of a retaining arm member of the retention mechanism.
Figure 4:
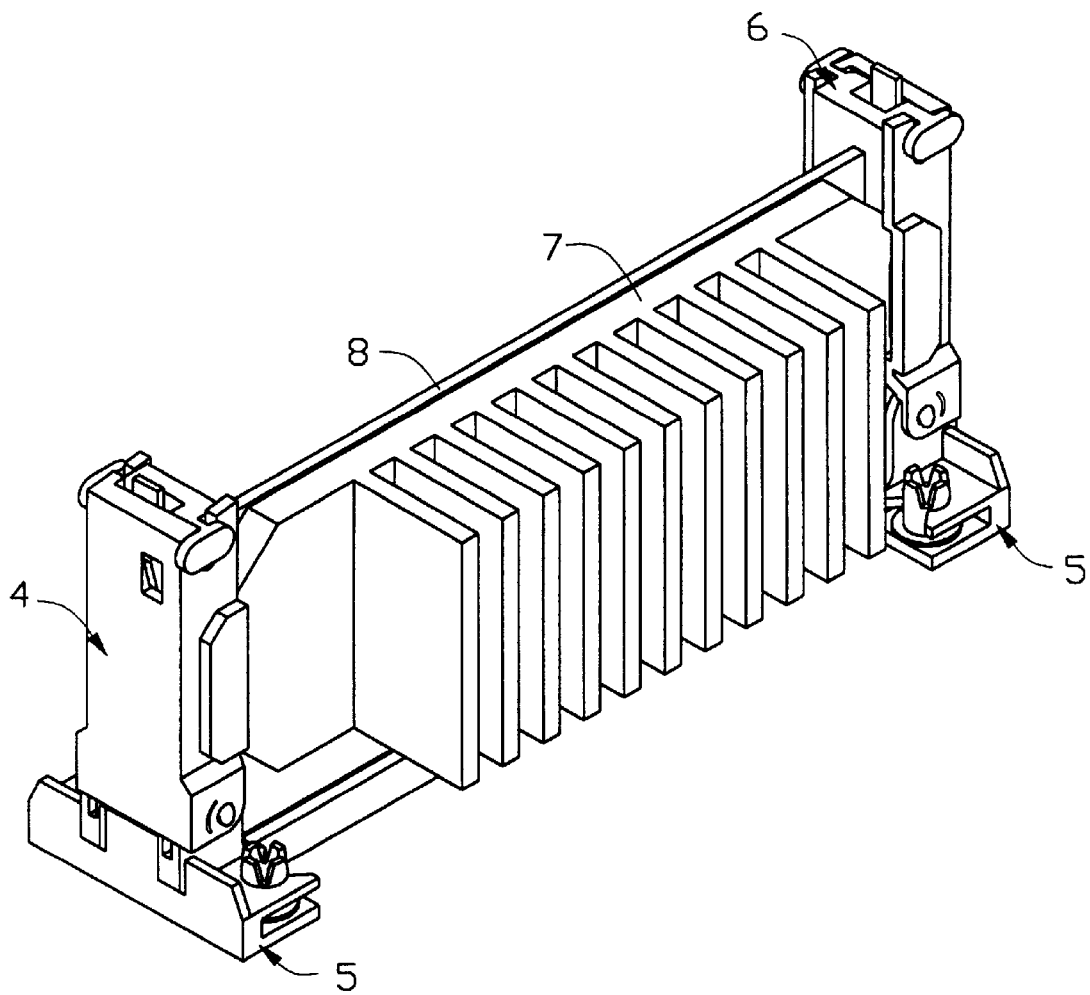
FIG. 4 is a perspective view of the retention mechanism of FIG. 2 engaging with the CPU and the heat sink.

It is noted here that for facilitating understanding, like components are designated by like reference numerals throughout the various embodiments of the invention as shown in the attached drawings. Referring to FIGS. 2, 3, and 4, a foldable retention mechanism includes a pair of bases 5 connected by an elongate body 52 and a retaining arm member 4 mounted to each base by a pair of lugs 53 formed in connection portion 51, and the connection portion 51 is formed at lateral ends of the body 52. A guiding slot 41 is defined in each retaining arm member 4 for receiving a CPU package 8 therein. A recess 42 is defined in opposite inner surface of each arm 4 for engaging with a corresponding projection 71 of a heat sink 7. Thus, the CPU package 8 and the heat sink can be securely mounted in the retention mechanism. A receiving portion 43 outwardly extends from outer surfaces of each arm 4 for strengthening the corresponding recess 42. A hole 45 defined through each arm 4 in communication with the corresponding guiding slot 41. A locking member 6 includes a locking element 61 and a locking slot 62. The locking member 6 is mounted to a free end of each arm 4 and engages with the hole 45 by means of the locking element 61. The CPU package 8 can be fixed within the guiding slots 41 by engaging with the locking slots 62. Thus, movement of the CPU package 8 within the guiding slot 41 is restricted and functioned reliability is improved.

Figure 5:
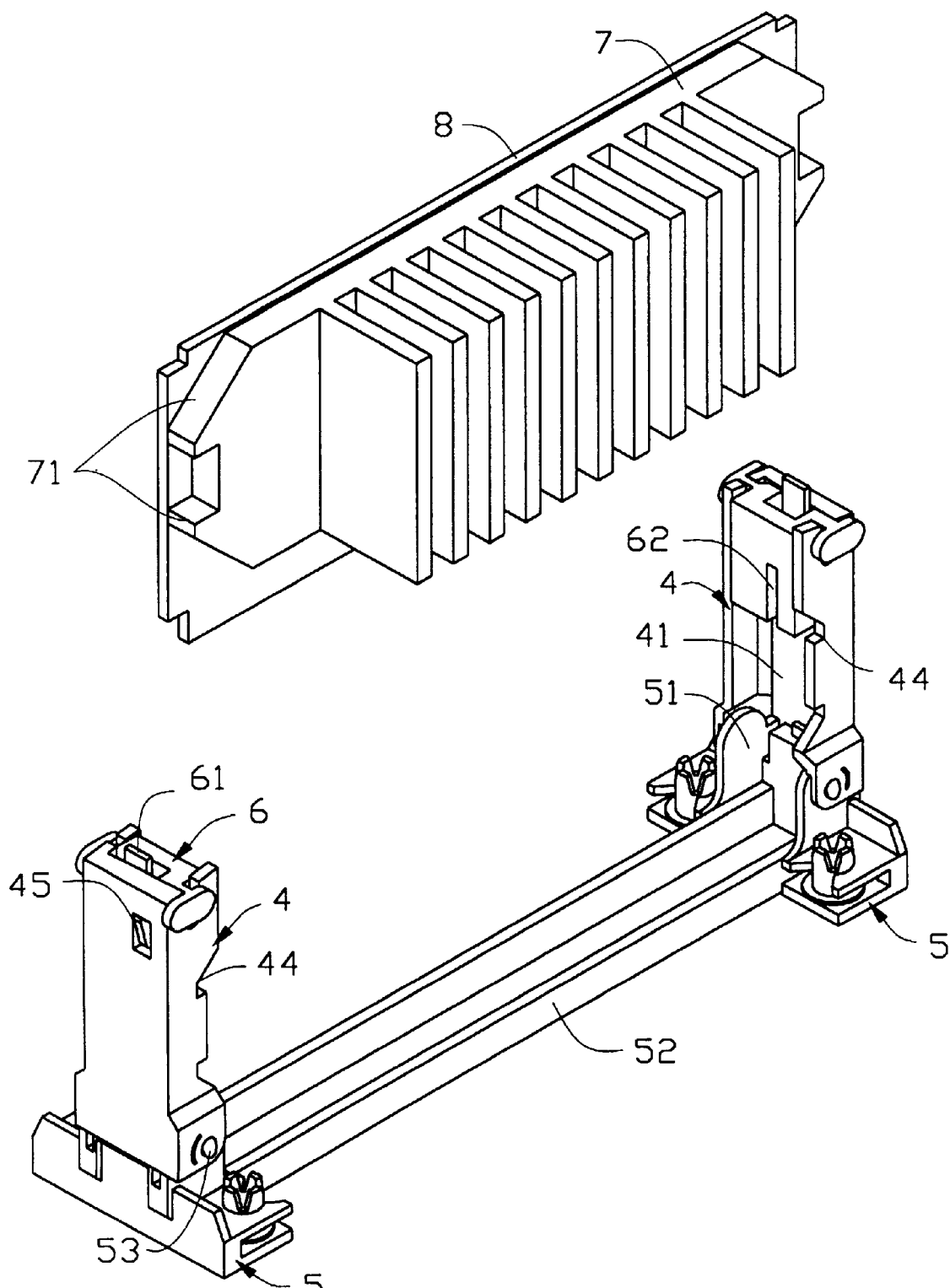
FIG. 5 is a perspective view of a foldable retention mechanism in accordance with a second embodiment of the present invention, the CPU, and the heat sink.
Figure 6:
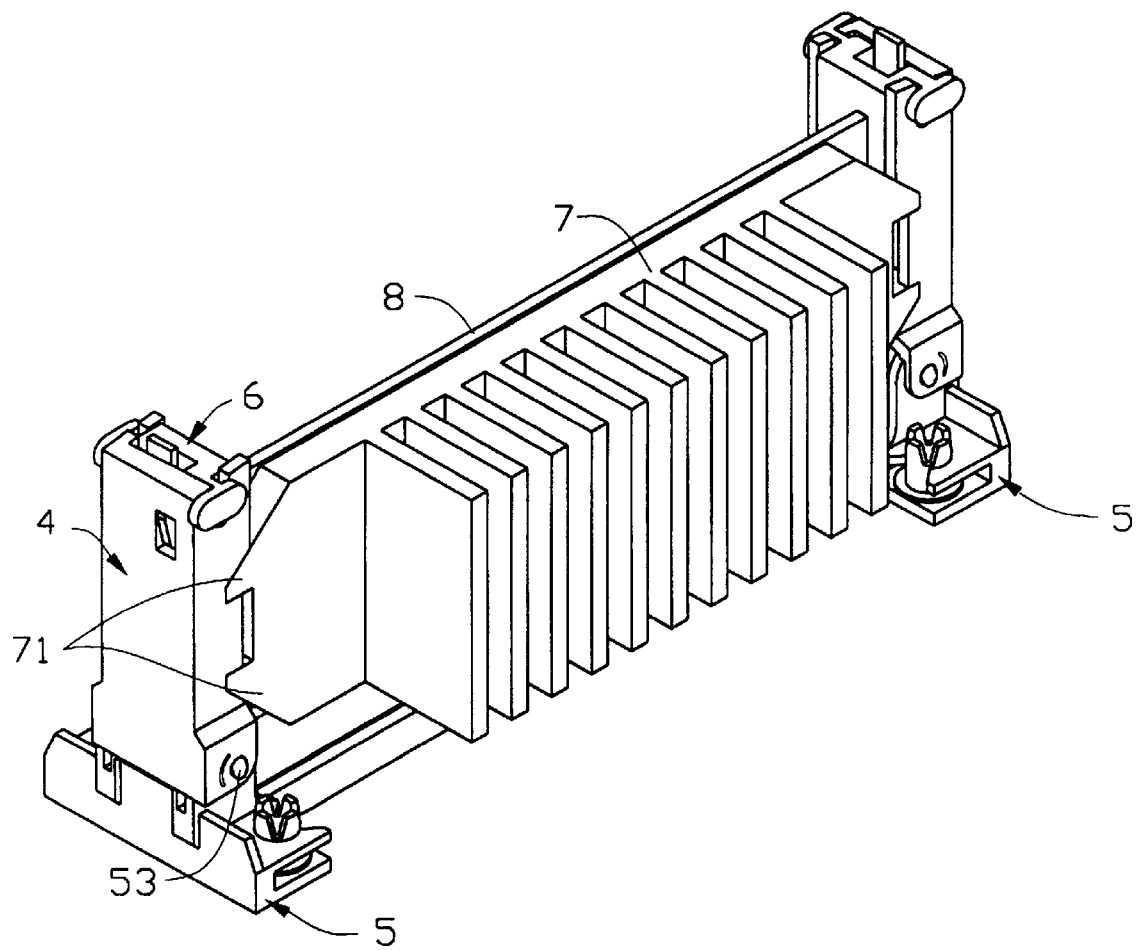
FIG. 6 is a perspective view of the retention mechanism of FIG. 5 engaging with the CPU and the heat sink.

Referring to FIGS. 5 and 6 which disclose a second embodiment of the invention, the retaining arm members 4 are each mounted to the corresponding base 5 by means of the lugs 53 whereby each retaining arm member 4 pivots about the lugs 53. A pair of receiving cutouts 44 is defined in each retaining arm member 41 for engaging with the corresponding projections 71 of the heat sink 7. Thus, the retention mechanism can adapt to a CPU package 8 and a heat sink 7 with different thickness. In addition, the vertical position of the heat sink 7 can be adjusted by the position of the receiving cutout 44. The locking member 6 is positioned at the free end of each retaining arm member 4 and engages with the hole 45 by means of locking element 61. The CPU package 8 is retained in the guiding slots 4 by engaging with the locking slots 62 of the locking member 6.

Figure 7:
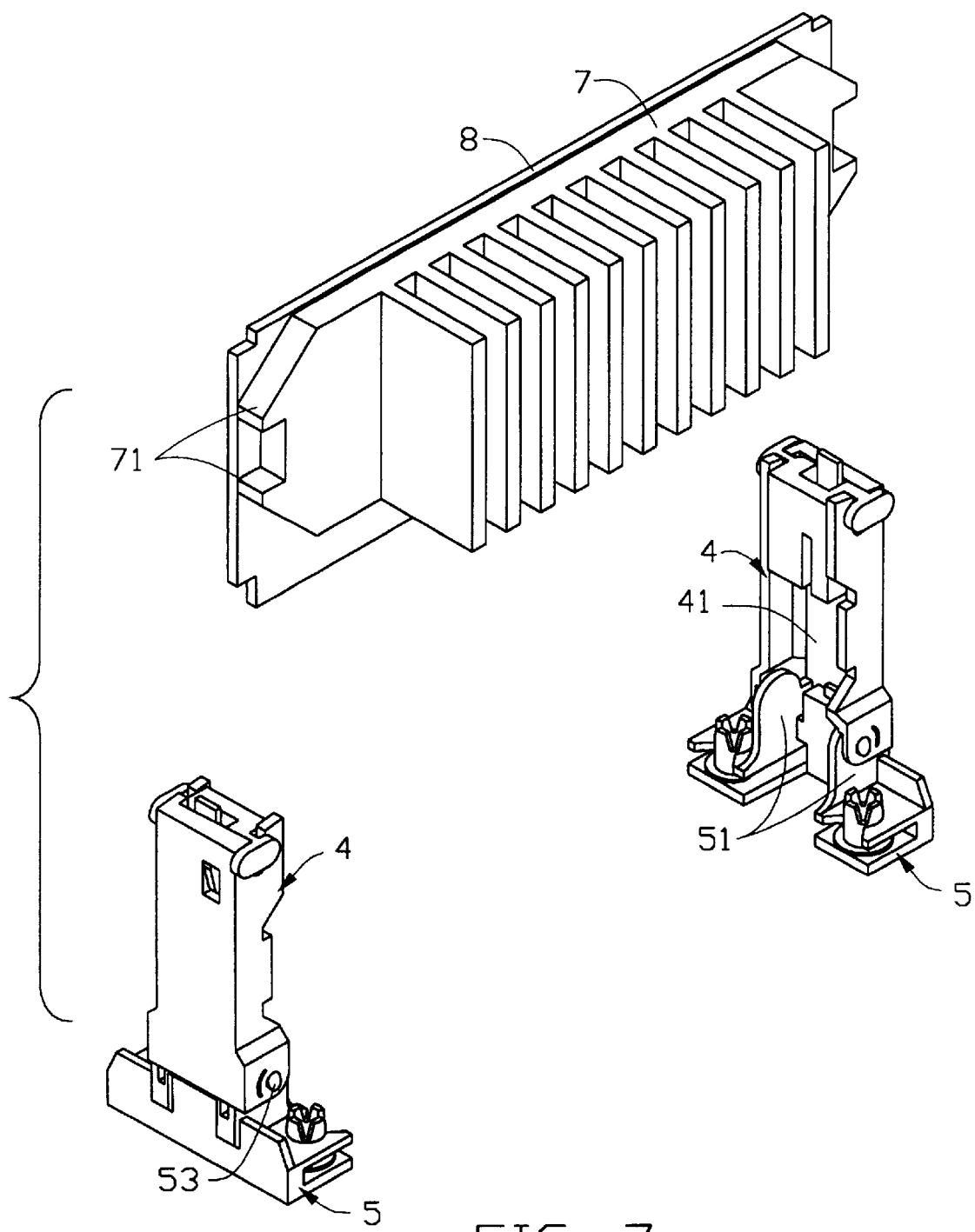
FIG. 7 is a perspective view of a foldable retention mechanism in accordance with a third embodiment of the present invention, the CPU, and the heat sink.

Referring to FIG. 7, in a third embodiment of the invention, each base 5 is separately positioned on a substrate (not shown) and distanced from each other. Each retaining arm member 4 is positioned on the corresponding base 5 and the CPU package 8 and heat sink 7 are retained in the retention mechanism as described in the second embodiment. Such an arrangement allows the retention mechanism to accommodate CPU package 8 and heat sink 7 of different lengths.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A foldable retention mechanism for retaining a CPU package and a heat sink, comprising:

a pair of bases distanced from each other, each base having a pair of lugs;

a pair of retaining arm members each attached to corresponding lugs of the base, each retaining arm member comprising a guiding slot and means for engaging with edge portions of the heat sink; and a locking member positioned at a free end of each retaining arm member, each locking member comprising a locking element and a locking slot for engaging with the CPU package.

2. The foldable retention mechanism as claimed in claim 1, wherein the means for engaging comprises a receiving portion extending from outer surfaces of each retaining arm member to form a recess.

3. The foldable retention mechanism as claimed in claim 1, wherein the means for engaging comprises a pair of receiving cutouts defined in each retaining arm member.

4. The foldable retention mechanism as claimed in claim 1, wherein a pair of projections is formed at lateral sides of the heat sink for engaging with corresponding recess of the foldable retention mechanism.

5. The foldable retention mechanism as claimed in claim 4, wherein the projections engages in corresponding receiving cutouts of the foldable retention mechanism.

6. The foldable retention mechanism as claimed in claim 1, the foldable retention mechanism further comprises an elongate body connecting the two bases.

7. An electrical assembly comprising:
a CPU package with a heat sink attached thereon;
a pair of bases distanced from each other; and
a pair of retaining arm members pivotably attached to the corresponding bases, respectively, each of said retaining arm members including a guiding slot and one recess formed by one side of said guiding slot; wherein
the CPU package is retained in the guiding slot through a locking member, and a lateral side of the heat sink is dimensioned to be engageably and restrainedly received within said recess.

* * * * *